(12) United States Patent
Tran et al.

(10) Patent No.: US 9,997,411 B2
(45) Date of Patent: Jun. 12, 2018

(54) FORMATION OF METAL RESISTOR AND E-FUSE

(71) Applicant: International Business Machines Corporation, Armonk, NY (US)

(72) Inventors: Cung Tran, Newburgh, NY (US); Emre Alptekin, Fishkill, NY (US); Viraj Sardesai, Poughkeepsie, NY (US); Reinaldo Vega, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 14/837,580

(22) Filed: Aug. 27, 2015

(65) Prior Publication Data

US 2015/0364419 A1 Dec. 17, 2015

Related U.S. Application Data

(62) Division of application No. 14/270,791, filed on May 6, 2014, now Pat. No. 9,312,185.

(51) Int. Cl.
*H01L 21/8234* (2006.01)
*H01L 29/66* (2006.01)
(Continued)

(52) U.S. Cl.
CPC ........ *H01L 21/823475* (2013.01); *H01L 21/31055* (2013.01); *H01L 21/32* (2013.01);
(Continued)

(58) Field of Classification Search
CPC ....... H01L 21/823475; H01L 21/31055; H01L 21/32; H01L 21/823443; H01L 23/5228; H01L 23/5256; H01L 27/0629
(Continued)

(56) References Cited

U.S. PATENT DOCUMENTS 6,333,223 B1  12/2001  Moriwaki et al.
7,563,701 B2   7/2009  Chang et al.
(Continued)

FOREIGN PATENT DOCUMENTS

CN  101740543 A  6/2010
CN  102738114 A  10/2012

OTHER PUBLICATIONS

Office Action Communication for U.S. Appl. No. 14/270,791 dated Sep. 24, 2015, 13 pages.
(Continued)

*Primary Examiner* — Ori Nadav
(74) *Attorney, Agent, or Firm* — Steven J. Meyers; Hoffman Warnick LLC

(57) ABSTRACT

Embodiments of present disclosure provide methods of forming a resistor. One such method can include forming a first transistor structure and a second transistor structure on a semiconductor substrate, wherein the first transistor structure includes a dummy gate thereon; forming a mask on the first transistor structure; forming a metal gate on the second transistor structure; removing the mask, after the forming of the metal gate, to expose the first transistor structure; and siliciding a top portion of the dummy gate of the first transistor structure to yield a resistor.

14 Claims, 17 Drawing Sheets

(51) Int. Cl.
*H01L 29/49* (2006.01)
*H01L 29/45* (2006.01)
*H01L 21/3105* (2006.01)
*H01L 21/32* (2006.01)
*H01L 23/522* (2006.01)
*H01L 23/525* (2006.01)
*H01L 49/02* (2006.01)
*H01L 27/06* (2006.01)
*H01L 21/285* (2006.01)
*H01L 21/768* (2006.01)

(52) U.S. Cl.
CPC .. *H01L 21/823443* (2013.01); *H01L 23/5228* (2013.01); *H01L 23/5256* (2013.01); *H01L 27/0629* (2013.01); *H01L 28/20* (2013.01); *H01L 28/24* (2013.01); *H01L 29/45* (2013.01); *H01L 29/4975* (2013.01); *H01L 29/665* (2013.01); *H01L 29/66515* (2013.01); *H01L 29/66545* (2013.01); *H01L 21/28518* (2013.01); *H01L 21/76897* (2013.01); *H01L 2924/0002* (2013.01)

(58) Field of Classification Search
USPC .......................................................... 438/382
See application file for complete search history.

(56) References Cited

U.S. PATENT DOCUMENTS

| | | | |
|---|---|---|---|
| 8,367,494 B2 | 2/2013 | Li et al. | |
| 8,481,397 B2 | 7/2013 | Booth, Jr. et al. | |
| 8,492,286 B2 | 7/2013 | Utomo et al. | |
| 8,685,827 B2 | 4/2014 | Kim et al. | |
| 9,006,804 B2 | 4/2015 | Hung et al. | |
| 2005/0142779 A1 | 6/2005 | Cheong et al. | |
| 2010/0320509 A1* | 12/2010 | Knorr | H01L 21/76832 257/288 |
| 2012/0129312 A1 | 5/2012 | Utomo et al. | |
| 2012/0256267 A1 | 10/2012 | Li et al. | |
| 2014/0011333 A1 | 1/2014 | McKee et al. | |

OTHER PUBLICATIONS

Notice of Allowance and Fee(s) Due for U.S. Appl. No. 14/270,791 dated Jan. 14, 2016, 8 pages.

Office Action Communication for U.S. Appl. No. 14/270,791 dated Jun. 16, 2015, 16 pages.

* cited by examiner

FORMATION OF METAL RESISTOR AND E-FUSE

FIELD

The present invention relates generally to the field of semiconductor device manufacturing and in particular relates to metal resistor and e-fuse, and method of forming thereof in a process compatible with process of forming replacement-metal-gate with self-aligned contact.

BACKGROUND

As semiconductor device manufacturing technology continues to evolve, new manufacturing processes and/or device structures such as, for example, replacement-metal-gate (RMG) and self-aligned-contact (SAC) are being introduced and applied to devices and in particular in smaller node environment such as, for example, 10 nm node and beyond. As a result, currently existing technologies of manufacturing metal resistor and electronic-fuse (e-fuse), that are mainly adapted for manufacturing devices up to 20 nm and 14 nm node, become incompatible with the newly introduced processes and/or structures of RMG and/or SAC.

For example, in a conventional 14 nm node manufacturing process, metal resistor and/or e-fuse are typically made through, for example, steps of forming or depositing a tungsten silicide (WSix) layer on top of a blanket nitride cap layer and patterning the tungsten silicide layer, for example through a photolithographic patterning process, into a desired shape or shapes which eventually form resistor and/or e-fuse, depending on their specific application. However, in a 10 nm RMG process, steps are performed to create metal recess, deposit nitride material in the recess, and subsequently polish the nitride material to create nitride cap. It is obvious that, due to the nature of applying a reactive-ion-etching (RIE) process in forming self-aligned contact, a separate step of blank nitride deposition no longer exists to be even available for the purpose of forming metal resistor and/or e-fuse, as opposed to be in a conventional process for a 14 nm node.

SUMMARY

Embodiments of present disclosure provide a method of forming metal resistors. The method includes providing a semiconductor substrate; forming a group of transistor structures designated for forming transistors and at least one additional transistor structure designated for forming a metal resistor on the semiconductor substrate; forming an etch-stop mask directly on top of the additional transistor structure; with the etch-stop mask protecting the additional transistor structure, replacing sacrificial gates in the group of transistor structures to form metal gates of the transistors; removing the etch-stop mask, after forming the metal gates, to expose the additional transistor structure; forming a silicide in the additional transistor structure as the metal resistor; and forming contacts to the silicide.

According to one embodiment, forming the silicide includes siliciding a top portion of a sacrificial gate of the additional transistor structure to form the metal resistor.

According to one further embodiment, forming contacts to the silicide includes depositing a dielectric layer on top of the additional transistor structure covering the silicided top portion of the sacrificial gate; and forming at least two contacts through the dielectric layer contacting the silicided top portion of the sacrificial gate.

According to another embodiment, forming the silicide includes removing a sacrificial gate of the additional transistor structure; siliciding a channel region of the additional transistor structure, the channel region being previously underneath the sacrificial gate and being exposed by the removal thereof; and covering the silicided channel region with a dielectric material.

According to one further embodiment, forming contacts to the silicide includes forming at least one metal contact to a source/drain region of the additional transistor structure, the forming at least one metal contact being performed in a same process as forming one or more contacts to source/drain regions of the transistors.

One embodiment of present disclosure further includes, before removing the etch-stop mask, making recesses in a top portion of at least one of the metal gates of the transistors; and depositing a dielectric material on top of the transistors and on top of the etch-stop mask, the dielectric material filling the recesses.

In one embodiment, removing the etch-stop mask includes applying a chemical-mechanic-polishing (CMP) process in removing the dielectric material on top of the transistor, removing the etch-stop mask together with the dielectric material, exposing the additional transistor structure underneath the etch-stop mask and leaving only a dielectric cap the recesses of the at least one of the metal gates.

In one embodiment, the dielectric material and the etch-stop mask have a significantly similar property relating to the CMP process. In another embodiment, the dielectric material and the etch-stop mask include a same dielectric material.

Another embodiment of the present disclosure can provide a method including: forming a first transistor structure and a second transistor structure on a semiconductor substrate, wherein the first transistor structure includes a dummy gate thereon; forming a mask on the first transistor structure; forming a metal gate on the second transistor structure; removing the mask, after the forming of the metal gate, to expose the first transistor structure; and siliciding a top portion of the dummy gate of the first transistor structure to yield a resistor.

Yet another embodiment of the present disclosure can provide a method including: forming a first transistor structure and a second transistor structure on a semiconductor substrate, wherein each of the first and second transistor structures include a dummy gate thereon; forming a mask on the first transistor structure; replacing the dummy gate of the second transistor structure with a metal gate to form a transistor; removing the mask to expose the first transistor structure; and siliciding a top portion of the dummy gate of the first transistor structure to form a resistor.

An additional embodiment of the present disclosure can provide a method including: forming a first and a second transistor structure on a semiconductor substrate, wherein each of the first transistor structure and the second transistor structure includes: a source/drain region positioned within the semiconductor substrate, and a dummy gate positioned over the source/drain region, wherein the source/drain region of the first transistor structure further includes a silicide layer thereon; forming a mask on the first transistor structure; forming a replacement metal gate on the second transistor structure to yield a transistor; removing the mask to expose the dummy gate of the first transistor structure;

and siliciding a top portion of the dummy gate of the second transistor structure to form a resistor.

BRIEF DESCRIPTION OF THE DRAWINGS

The present disclosure will be understood and appreciated more fully from the following detailed description of preferred embodiments, taken in conjunction with the accompanying drawings of which.

Figure 1:
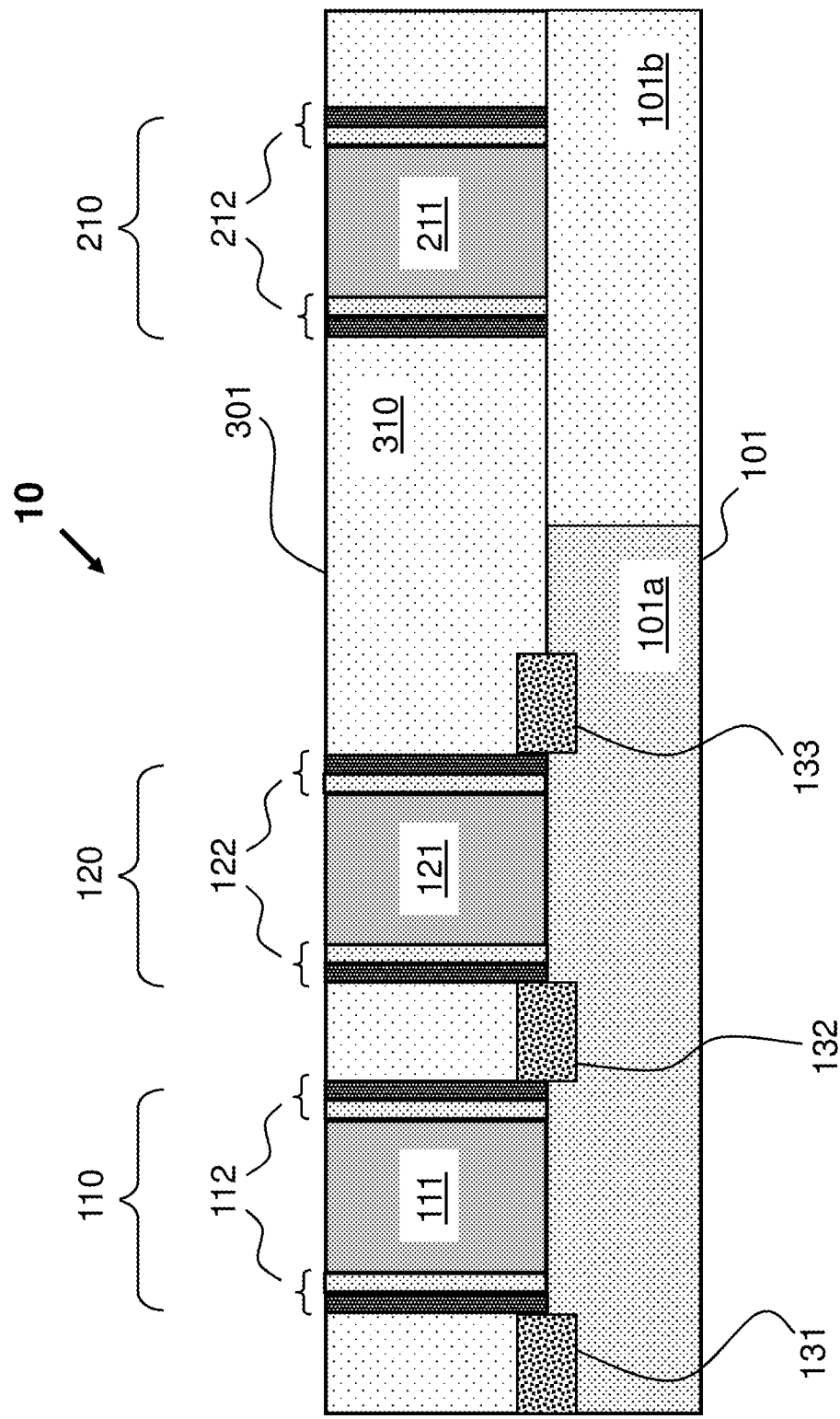
FIG. 1 is a demonstrative illustration of a step of a method of forming metal resistor and e-fuse integrated in a process of forming replacement-metal-gate with self-aligned contact according to one embodiment of present disclosure.

It will be appreciated that for purpose of simplicity and clarity of illustration, elements in the drawings have not necessarily been drawn to scale. For example, dimensions of some of the elements may be exaggerated relative to those of other elements for clarity purpose.

DETAILED DESCRIPTION

In the following detailed description, numerous specific details are set forth in order to provide a thorough understanding of various embodiments of the disclosure. However, it is to be understood that embodiments of present disclosure may be practiced without these specific details.

In the interest of not obscuring presentation of essences and/or embodiments of the disclosure, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the disclosure. It is to be understood that the following descriptions may have rather focused on distinctive features and/or elements of various embodiments of the disclosure.

FIG. 1 is a demonstrative illustration of a step of a method of forming metal resistor and e-fuse integrated in a process of forming replacement-metal-gate with self-aligned contact according to one embodiment of present disclosure. More specifically, as being illustrated in FIG. 1, a semiconductor substrate 101 may be provided and one or more structures such as, for example, structures 110 and 120 may be formed in an active region 101a of substrate 101 to form active transistors. In the meantime, additional structures may be formed in other areas of substrate 101 and such additional structures may be used to form metal resistor and/or e-fuse in later steps as being described below in more details. For example, in one embodiment, a structure 210 may be formed on insulated region 101b of substrate 101 as being illustrated in FIG. 1 to form metal resistor and/or e-fuse later. In another embodiment a structure 220, as being demonstratively illustrated in FIG. 10, may be formed in a non-insulated region, such as in a region similar to or same as active region 101a of substrate 101 to have a structure similar to structures 110 and 120. Hereinafter, structures 210 and 220 may be referred to, from time to time, as non-active transistor structures and described in ways similar to those used for describing transistors (e.g., using terminologies such as "sacrificial gate", "spacers", "source/drain" etc.) solely for the ease of reference and description even though they may be formed eventually into metal resistors and/or e-fuses instead of transistors (active or non-active). This reference is particularly relevant since structures 210 and 220 may be transformed, in a process of making metal resistor and/or e-fuse, in steps whose majority is similar to those of transforming active transistor structures 110 and 120.

According to one embodiment, structures 210 or 220 (FIG. 10) may be formed to have same or similar structures as structures 110 and 120. Having similar structures may be preferable and may provide benefit such as simplifying design and manufacturing processes of the devices. Nevertheless, embodiment of present disclosure is not limited in this respect and structures 210 and 220 may be formed to have structural properties that are different from structures 110 and 120. For example, structures 210 and 220 may be formed to have their "channel" lengths, i.e., widths of structures 210 and 220 as being illustrated in FIG. 1 and FIG. 10, different from structures 110 and 120.

Semiconductor substrate 101 may include silicon (Si) substrate, silicon-germanium (SiGe) substrate, silicon-on-insulator (SOI) substrate, to list only a few, and in fact may include any types of substrate that is suitable for forming active transistors as well as metal resistors and/or e-fuse on top thereof.

Active transistor structure 110 may be formed, according to a replacement-metal-gate (RMG) process, to have a sacrificial gate 111 and one or more sets of spacers 112 adjacent to sidewalls of sacrificial gate 111. Similarly, active transistor structure 120 may be formed to have a sacrificial gate 121 and one or more sets of spacers 122 adjacent to sidewalls of sacrificial gate 121. Silicide 131, 132, and 133 may be formed in the source/drain regions of transistors 110 and 120, providing improved conductivity for contacts to the source/drain regions of transistors 110 and 120.

Structure 210 may be formed together with the formation of active transistor structures 110 and 120 to have a sacrificial "gate" 211 and one or more sets of spacers 212 adjacent to sidewalls of sacrificial gate 211. Although it may not be necessary to have sidewall spacers 212 in forming metal resistor or e-fuse using structure 210, sidewall spacers 212 may be formed in connection with the process of forming active transistors 110 and 120, thus avoiding the necessity of introducing additional steps and/or masks should structure 210 be desired to have a structure (such as without spacers) that is from those of structures 110 and 120.

As being illustrated in FIG. 1, structure 210 is formed in an insulated region of substrate 101 and no silicide is formed next to sacrificial gate 211 in the "source/drain" regions of substrate 101b. Here, it is to be noted that metal resistor and/or e-fuse formed from structure 210, as being described below in more details, has neither gate nor source nor drain. The use of terminology such as "gate", "source/drain" for structure 210 (and for structure 220 later) is solely for the purpose of description and shall be read in conjunction with the description of forming active structures or transistors 110 and 120. As being illustrated in FIG. 1, structure 10 may include structures 110, 120 and 210 that may be embedded inside a dielectric layer 310, all of which are then polished down to have a coplanar top surface 301.

Figure 2:
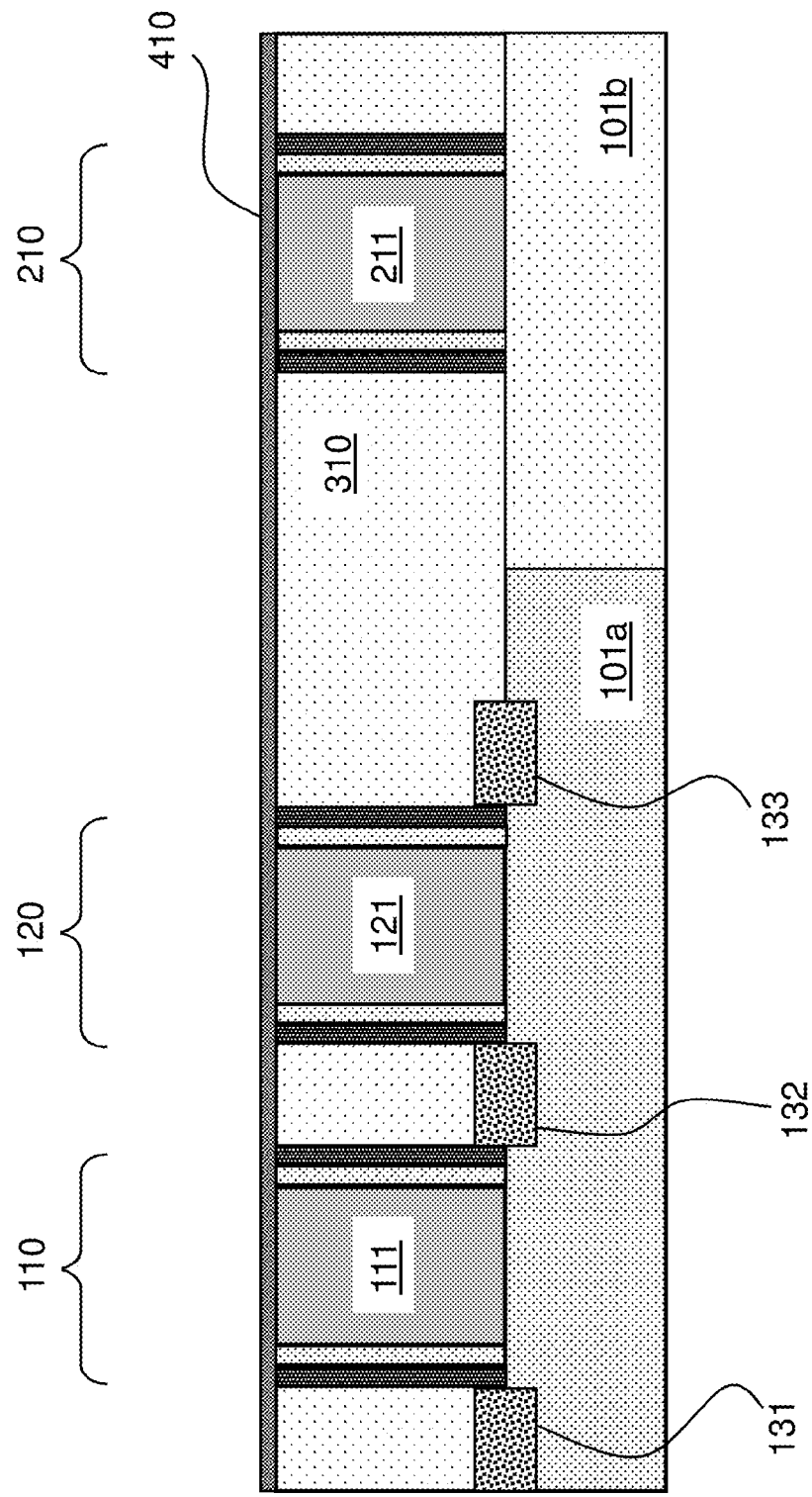
FIG. 2 is a demonstrative illustration of a step of a method of forming metal resistor and e-fuse integrated in a process of forming replacement-metal-gate with self-aligned contact, following the step illustrated in FIG. 1, according to one embodiment of present disclosure.

FIG. 2 is a demonstrative illustration of a step of a method of forming metal resistor and e-fuse integrated in a process of forming replacement-metal-gate with self-aligned contact, following the step illustrated in FIG. 1, according to one embodiment of present disclosure. More specifically, one embodiment of present disclosure includes providing protection for structure 210 during subsequent steps of transforming structures 110 and 120. For example, the method may include forming an etch-stop layer or protection layer 410 such as, for example, a nitride layer on top of surface 301 to cover structure 210. Nitride layer 410 may be formed by applying currently existing or future developed techniques, such as a chemical vapor deposition (CVD) process, on top of structure 210 to have a thickness around 5~10 nm. Etch-stop layer or protection layer 410 of other material may be used as well so long as it possesses the property to be able to withstand subsequent replacement-metal-gate process steps.

Figure 3:
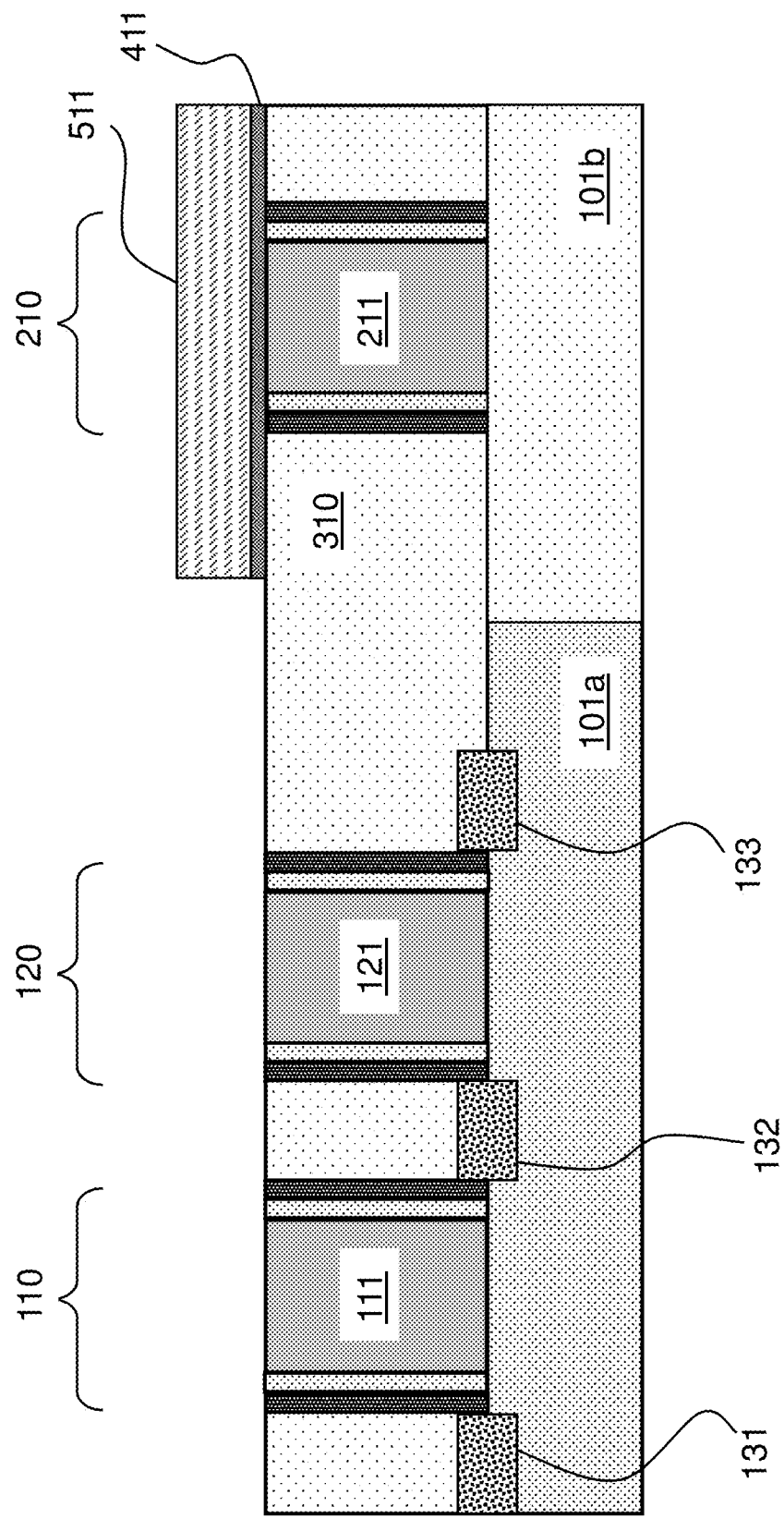
FIG. 3 is a demonstrative illustration of a step of a method of forming metal resistor and e-fuse integrated in a process of forming replacement-metal-gate with self-aligned contact, following the step illustrated in FIG. 2, according to one embodiment of present disclosure.

FIG. 3 is a demonstrative illustration of a step of a method of forming metal resistor and e-fuse integrated in a process of forming replacement-metal-gate with self-aligned contact, following the step illustrated in FIG. 2, according to one embodiment of present disclosure. In the process of forming nitride layer 410 covering structure 210, transistor structures 110 and 120 may become covered as well by etch-stop layer 410. The covered transistor structures 110 and 120 may be exposed again by removing portions of etch-stop layer 410 that are directly above transistor structures 110 and 120 through, for example, a patterning process. Specifically, according to one embodiment, the method may include applying a photo-resist layer on top of etch-stop layer 410 through for example a spin-on process, and subjecting the photo-resist layer to a photo-exposure in a photolithographic patterning process to form a resist mask 511 covering that portion of etch-stop layer 410. Next, the method may include applying a selective etching process, such as a reactive-ion-etching (RIE) process, to remove remaining portion of etch-stop layer 410 that are not covered by resist mask 511, resulting in an etch-stop mask or protection mask 411 that is only on top of structure 210.

Figure 4:
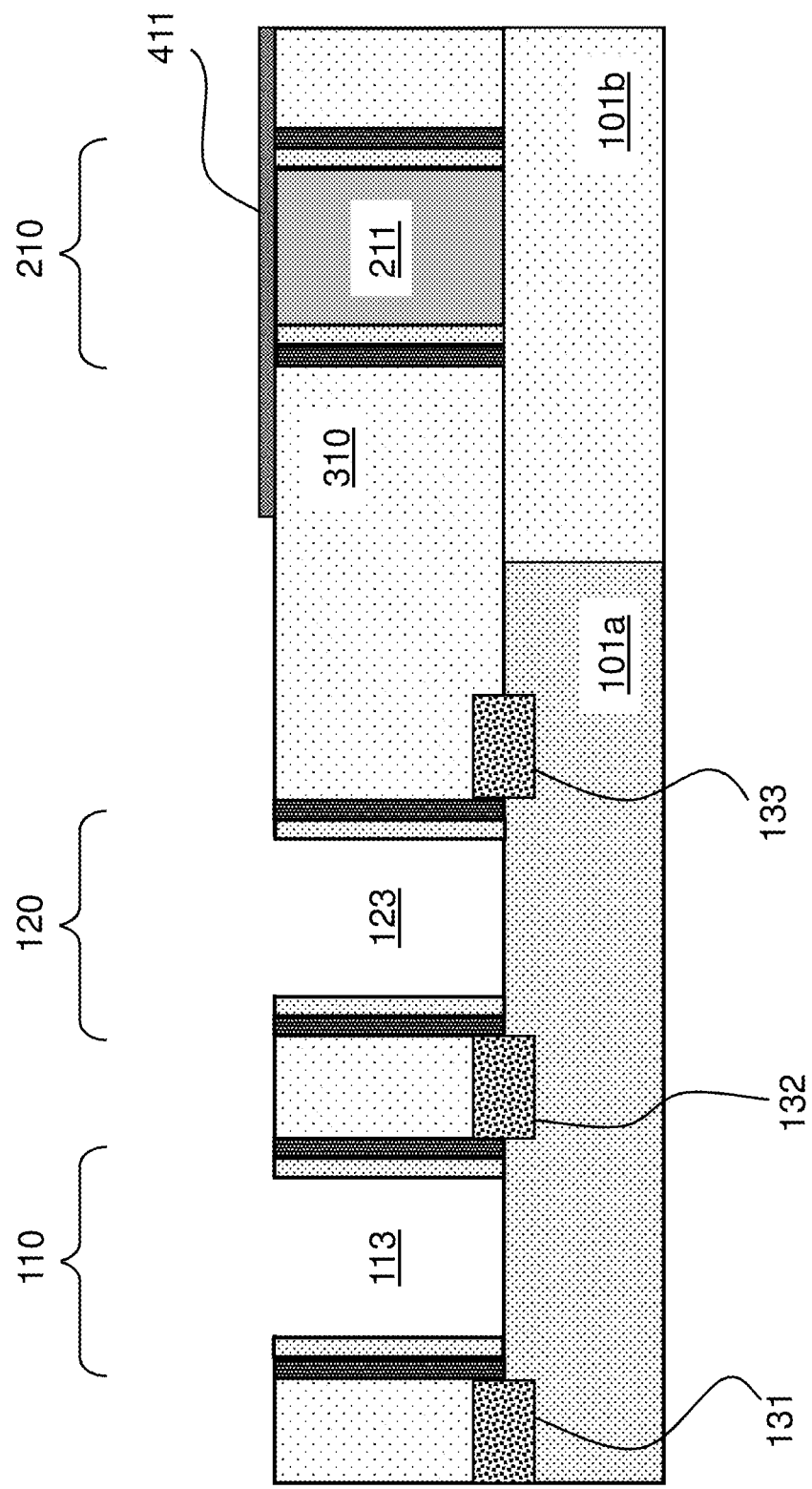
FIG. 4 is a demonstrative illustration of a step of a method of forming metal resistor and e-fuse integrated in a process of forming replacement-metal-gate with self-aligned contact, following the step illustrated in FIG. 3, according to one embodiment of present disclosure.

FIG. 4 is a demonstrative illustration of a step of a method of forming metal resistor and e-fuse integrated in a process of forming replacement-metal-gate with self-aligned contact, following the step illustrated in FIG. 3, according to one embodiment of present disclosure. After forming etch-stop mask or protection mask 411, resist mask 511 may optionally be removed by a plasma strip or wet chemical strip, for example. Subsequently, with etch-stop mask 411 protecting structure 210, sacrificial gates 111 and 121 of transistor structures 110 and 120 may be removed to expose underneath channel regions of the transistors which may be performed as part of the RMG process. Removal of sacrificial gates 111 and 121 may create openings 113 and 123 in the respective sacrificial gate regions.

Figure 5:
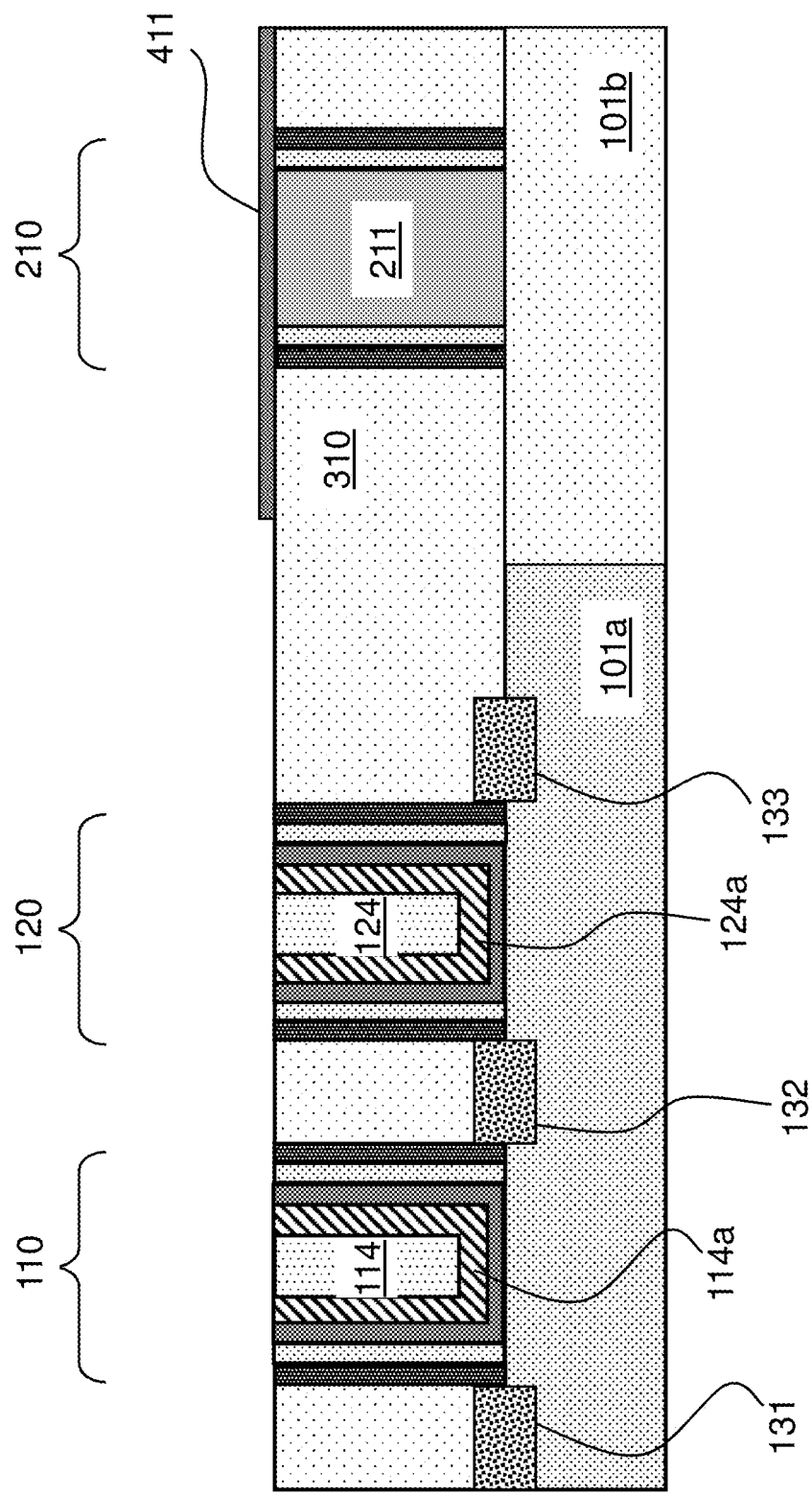
FIG. 5 is a demonstrative illustration of a step of a method of forming metal resistor and e-fuse integrated in a process of forming replacement-metal-gate with self-aligned contact, following the step illustrated in FIG. 4, according to one embodiment of present disclosure.

FIG. 5 is a demonstrative illustration of a step of a method of forming metal resistor and e-fuse integrated in a process of forming replacement-metal-gate with self-aligned contact, following the step illustrated in FIG. 4, according to one embodiment of present disclosure. For example, the method may include depositing one or more work function metal layers in the openings 113 and 123 that are created previously to line underneath channel regions of both transistors in active region 101a of substrate 101, and sidewalls of spacers 112 and 122. The method may further include filling up the remaining open areas inside openings 113 and 123 with additional metal or conductive material, such as tungsten (W), to finish forming metal gates 114 and 124. A metal CMP process may be used to polish off excess metals, including work function metals, that were deposited above the gate areas during above process. In some instances, etch-stop mask 411 may be used as a CMP stop during the metal CMP leaving a thin layer of metals (not shown), comparable to that of etch-stop mask 411, at the top of the gate areas.

Figure 6:
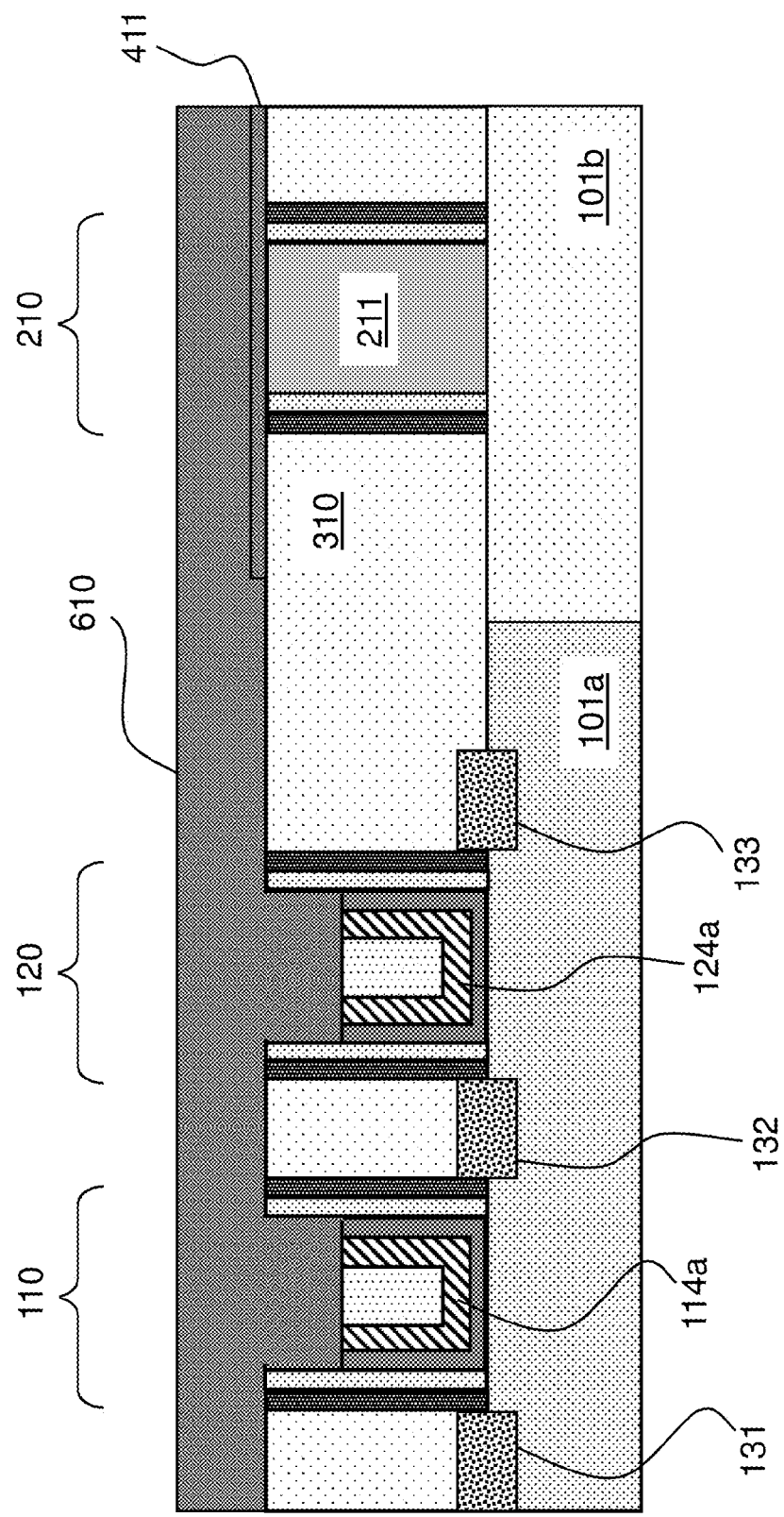
FIG. 6 is a demonstrative illustration of a step of a method of forming metal resistor and e-fuse integrated in a process of forming replacement-metal-gate with self-aligned contact, following the step illustrated in FIG. 5, according to one embodiment of present disclosure.

FIG. 6 is a demonstrative illustration of a step of a method of forming metal resistor and e-fuse integrated in a process of forming replacement-metal-gate with self-aligned contact, following the step illustrated in FIG. 5, according to one embodiment of present disclosure. More specifically, after forming metal gates 114 and 124 by filling up openings 113 and 123 with proper conductive materials, in order to form self-aligned contact to the transistors, an insulating layer (or cap) may be formed on top of the metal gates to prevent shorting metal gate to the source/drain of the transistors. For example, a dielectric layer such as, for example, a nitride layer may be formed in an upper portion of the metal gate to form a nitride cap. More specifically, metal gates 114 and 124 may first be recessed, through a selective metal etching process, to create recesses taking up the top portion of the metal gates 114 and 124 at a level below a top surface of dielectric layer 310. Subsequently, a dielectric layer such as a nitride layer 610, which may be similar to or same as etch-stop mask 411, may be deposited inside and on top of the recesses, on top of dielectric layer 310, and on top of etch-stop mask 411. Dielectric layer 610 may substantially fill in the recesses atop of the remaining portion 114a and 124a of metal gates 114 and 124.

Figure 7:
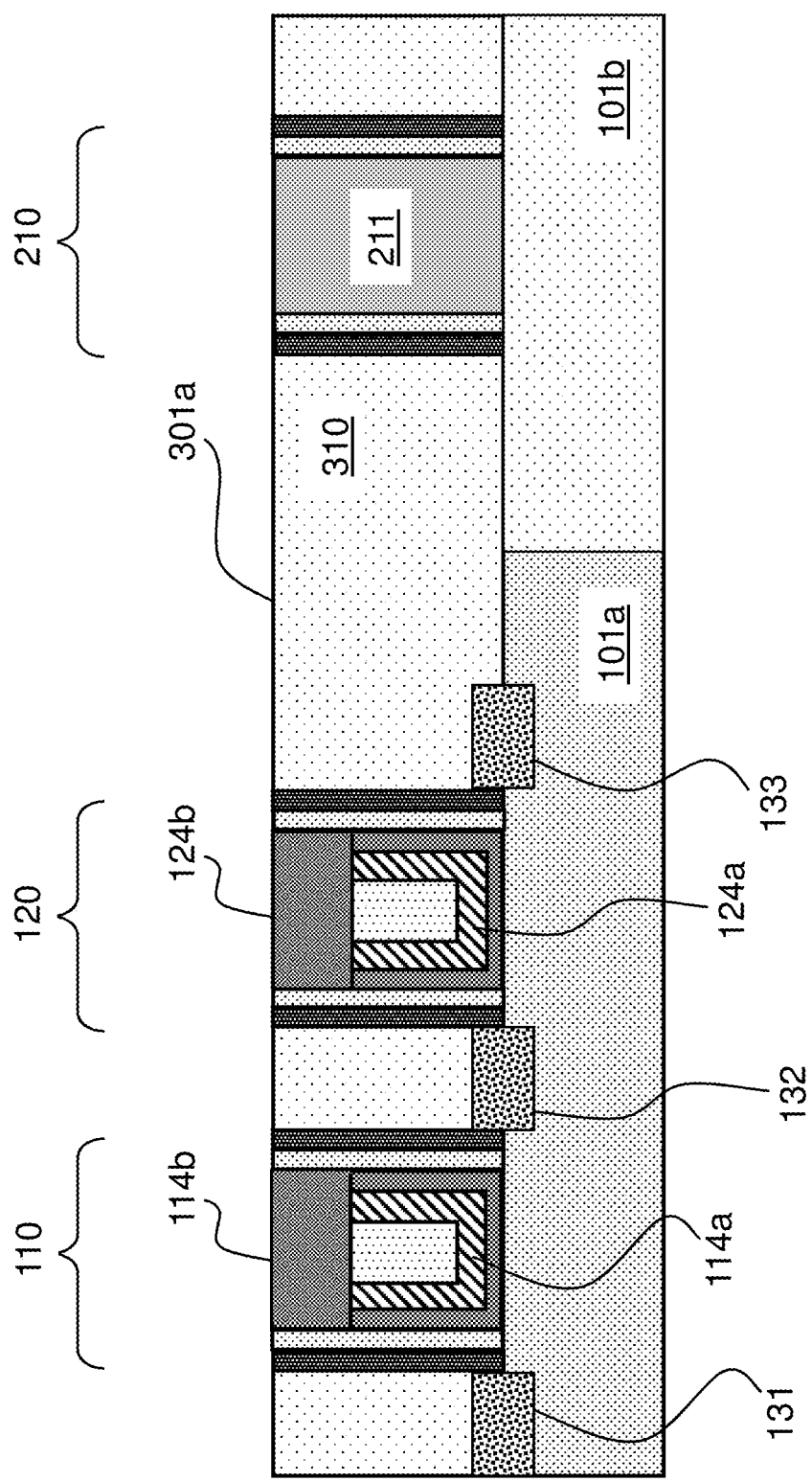
FIG. 7 is a demonstrative illustration of a step of a method of forming metal resistor and e-fuse integrated in a process of forming replacement-metal-gate with self-aligned contact, following the step illustrated in FIG. 6, according to one embodiment of present disclosure.

FIG. 7 is a demonstrative illustration of a step of a method of forming metal resistor and e-fuse integrated in a process of forming replacement-metal-gate with self-aligned contact, following the step illustrated in FIG. 6, according to one embodiment of present disclosure. More specifically, method of one embodiment of present disclosure may include, after filling up recesses above metal gates 114a and 124a with dielectric material, removing excessive material of dielectric layer 610 that may be above the top surface of dielectric layer 310 thereby leaving the dielectric material only inside the recesses above metal gates 114a and 124a to form dielectric cap 114b and 124b. In achieving the above, according to one embodiment of present disclosure, a method may include applying a chemical-mechanic-polishing (CMP) process to remove the excessive dielectric layer material. The removal process may at the same time remove etch-stop mask 411, thereby exposing structure 210 underneath etch-stop mask 411 for subsequent process of transforming structure 210 into metal resistor and/or e-fuse.

Figure 8:
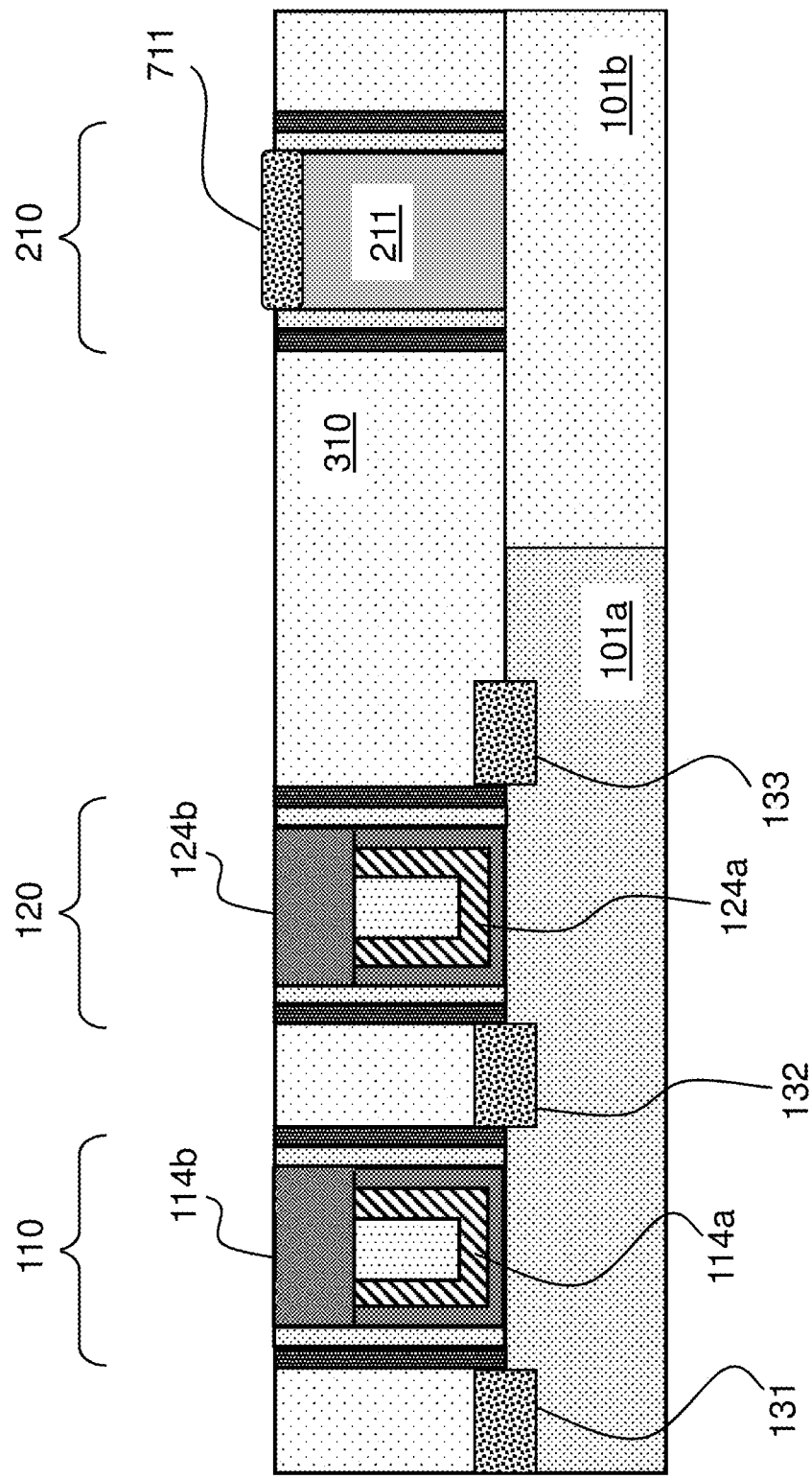
FIG. 8 is a demonstrative illustration of a step of a method of forming metal resistor and e-fuse integrated in a process of forming replacement-metal-gate with self-aligned contact, following the step illustrated in FIG. 7, according to one embodiment of present disclosure.

FIG. 8 is a demonstrative illustration of a step of a method of forming metal resistor and e-fuse integrated in a process of forming replacement-metal-gate with self-aligned contact, following the step illustrated in FIG. 7, according to one embodiment of present disclosure. With sacrificial "gate" 211 of structure 210 being exposed after removing etch-stop mask 411, silicide may be formed at a top portion of sacrificial gate 211. Silicide 711, which may be nickel-silicide for example, may be formed by first depositing a blanket layer of nickel on top of gate structure 211 and subsequently subjecting gate structure 211, with the layer of nickel on top thereof, to a thermal annealing process, thereby causing nickel to react with underneath silicon, polysilicon, or other gate material of sacrificial gate 211. After the thermal annealing process, excess metal of nickel may be removed by a selective removing process to have only silicide 711 remaining on top of sacrificial gate 211 thus transforming structure 210 into a metal resistor (although it may be referred to sometimes as a silicide resistor) or e-fuse. Here, it is to be noted that inside structure 210, sacrificial gate 211, unlike sacrificial gates 111 and 121, is no longer "sacrificial" but rather is a base material for forming metal resistor and/or e-fuse. It is further to be noted that silicide 711 formed at the top portion of structure 210 may work as a metal resistor or an e-fuse, depending on its specific usage.

Figure 9:
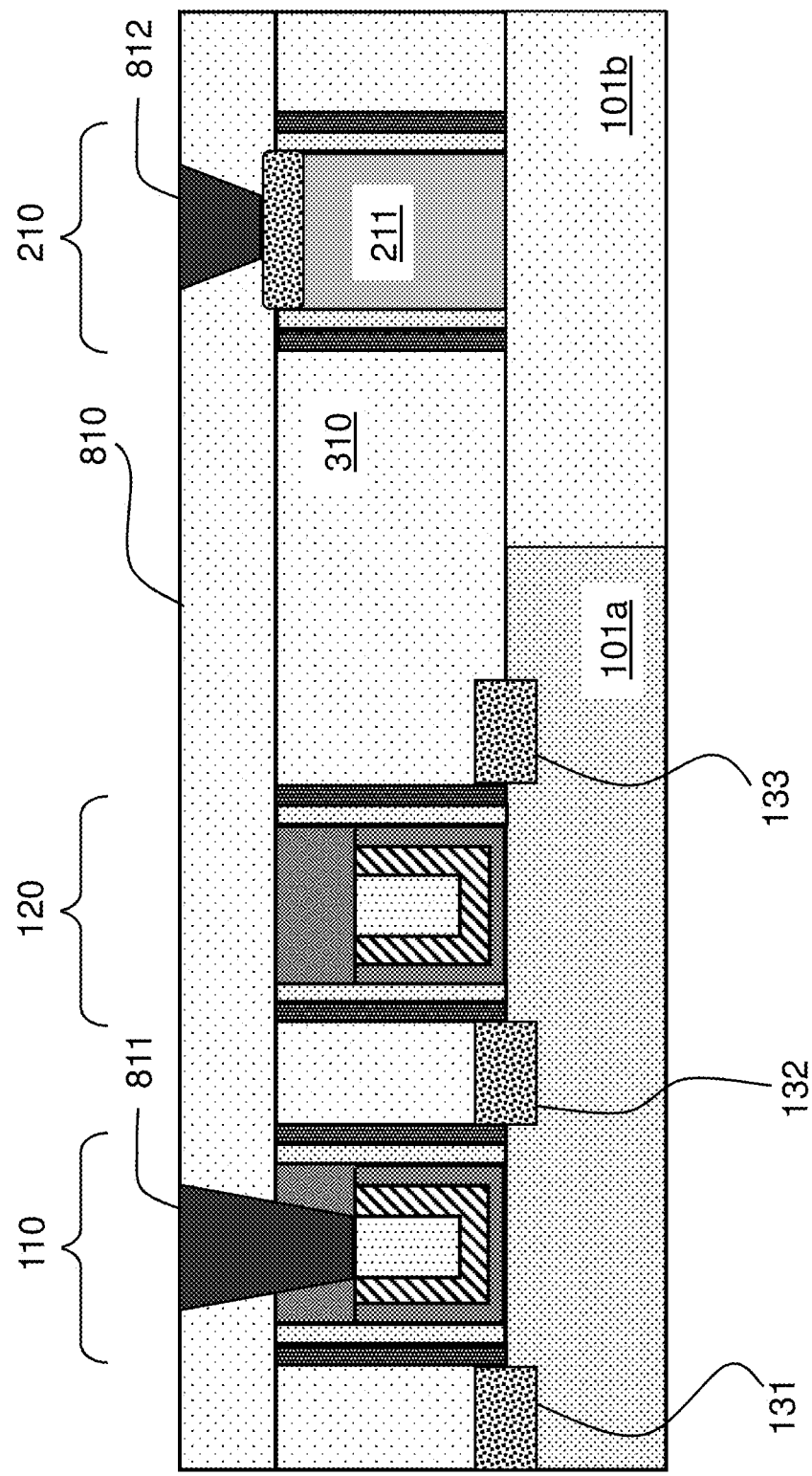
FIG. 9 is a demonstrative illustration of a step of a method of forming metal resistor and e-fuse integrated in a process of forming replacement-metal-gate with self-aligned contact, following the step illustrated in FIG. 8, according to one embodiment of present disclosure.

FIG. 9 is a demonstrative illustration of a step of a method of forming metal resistor and e-fuse integrated in a process of forming replacement-metal-gate with self-aligned contact, following the step illustrated in FIG. 8, according to one embodiment of present disclosure. After forming metal resistor or e-fuse 210, contacts may be formed to active transistors 110 and/or 120 and to metal resistor (or e-fuse) 210. In one embodiment, the method may include first depositing a dielectric layer 810 on top of and covering transistors 110 and 120 as well as metal resistor 210. Next, photolithographic patterning process may be applied to create via openings inside dielectric layer 810, and in the case of contact to the metal gate of transistor 110, for example, via openings through the nitride cap on top of the metal gate. Next, conductive materials such as various metals, including tungsten (W), copper (Cu), and/or aluminum (Al), may be deposited inside the via openings to form contacts 811 and 812. In order for metal resistor 210 function properly, there are at least two contacts made to get in contact with silicide 711, along the width direction of the "gate" 211, vertical to this paper.

Figure 10:
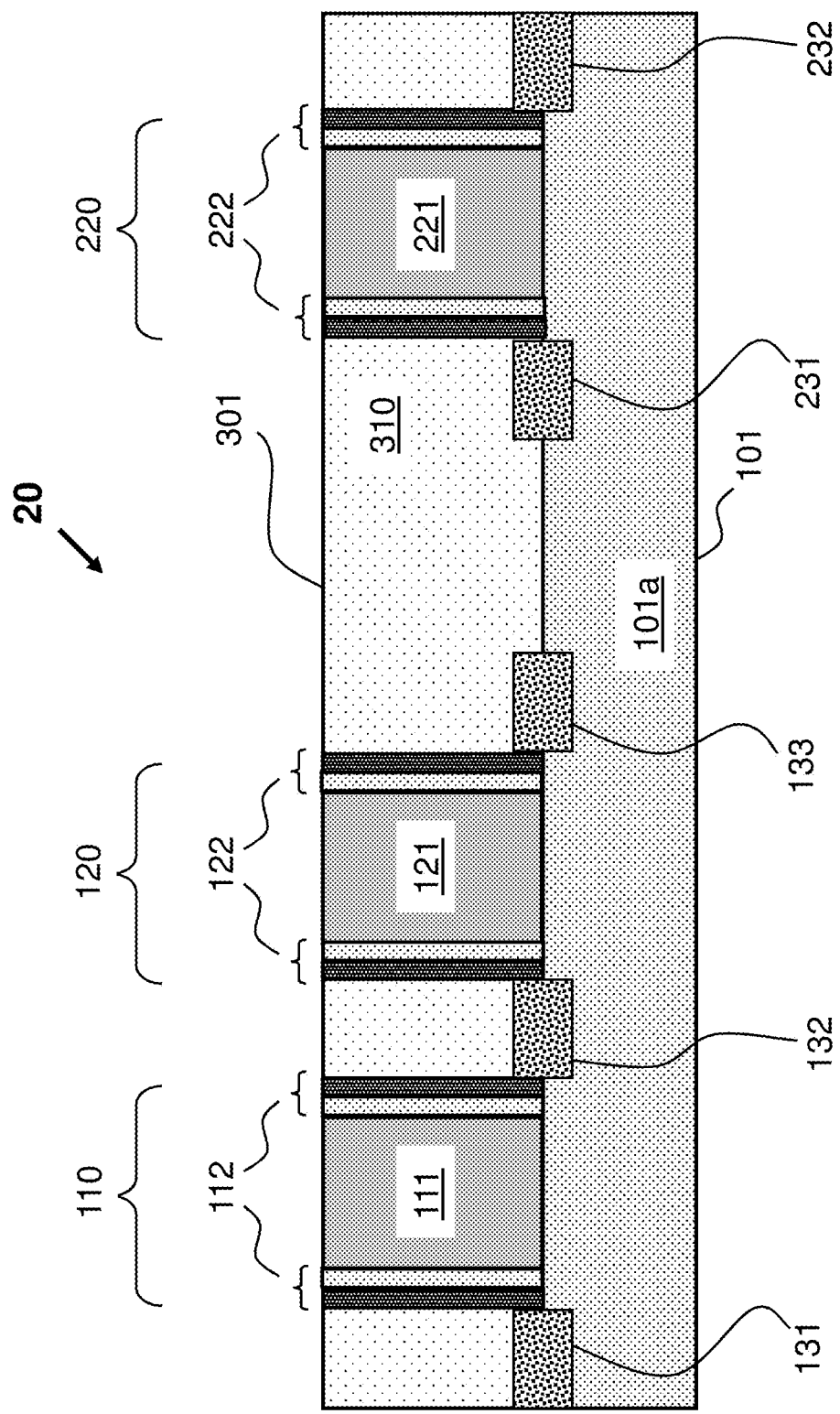
FIG. 10 is a demonstrative illustration of a step of a method of forming metal resistor and e-fuse integrated in a process of forming replacement-metal-gate with self-aligned contact according to another embodiment of present disclosure.

FIG. 10 is a demonstrative illustration of a step of a method of forming metal resistor and e-fuse integrated in a process of forming replacement-metal-gate with self-aligned contact according to another embodiment of present disclosure. As being described in connection with description of FIG. 1, instead of forming on top of an insulated region of substrate 101, structure 20 in FIG. 10 may include a structure 220 that is formed on top of a same active region 101a of substrate 101, as structures 110 and 120. In this embodiment illustrated in FIG. 10, structure 220 may be formed to include a sacrificial "gate" 221 with one or more sets of spacers 222 at sidewalls of the gate 221. Silicide 231 and 232 may be formed in the "source/drain" regions of structure 220, preferably being performed in a same process as that for forming active transistor structures 110 and 120 thereby without incurring any additional process steps.

Figure 11:
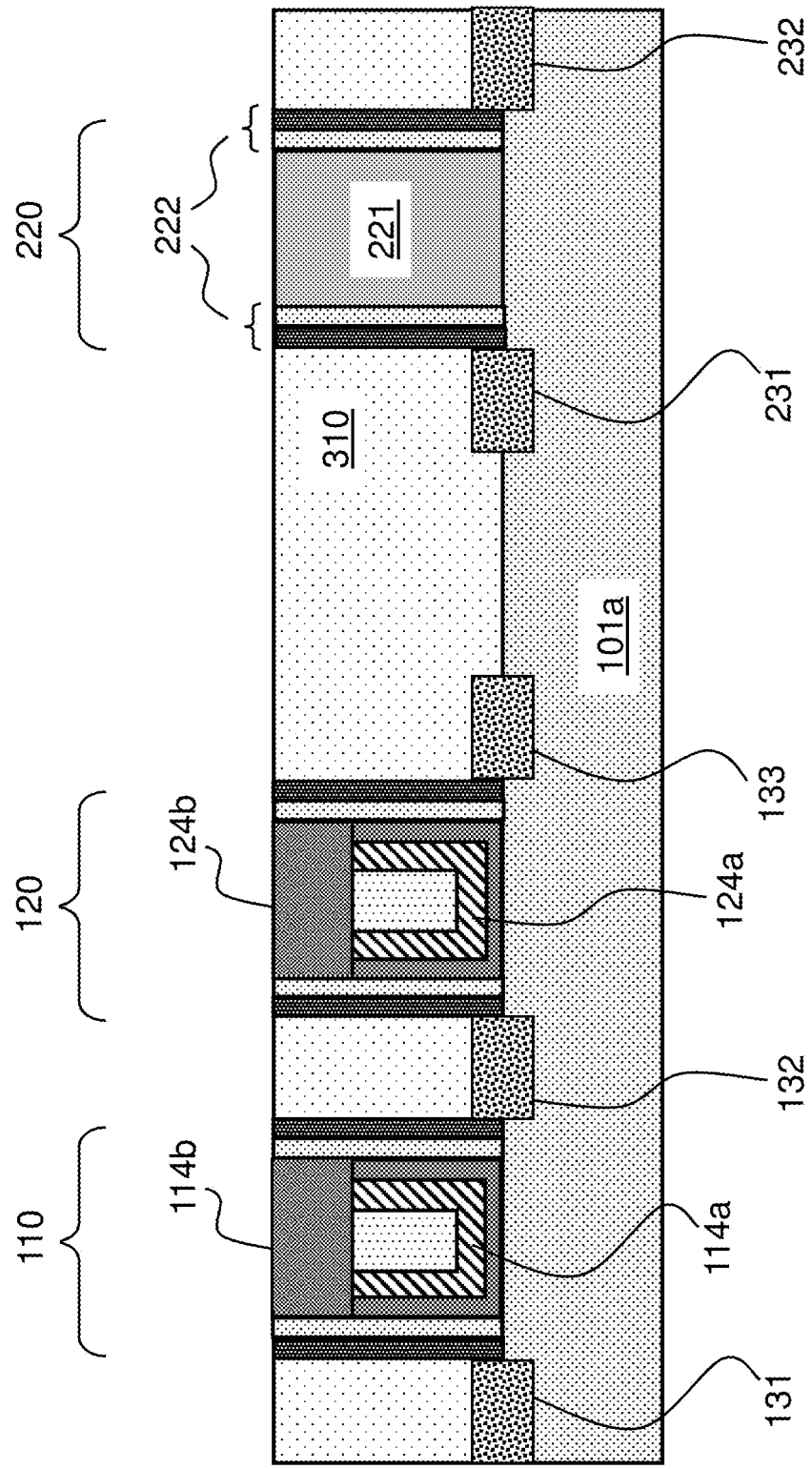
FIG. 11 is a demonstrative illustration of a step of a method of forming metal resistor and e-fuse integrated in a process of forming replacement-metal-gate with self-aligned contact, following the step illustrated in FIG. 10, according to one embodiment of present disclosure.

FIG. 11 is a demonstrative illustration of a step of a method of forming metal resistor and e-fuse integrated in a process of forming replacement-metal-gate with self-aligned contact, following the step illustrated in FIG. 10, according to one embodiment of present disclosure. With steps similar to those described above with respect to FIG. 2-FIG. 7, structure 20 illustrated in FIG. 10 may be transformed into having transistors 110 and 120 with metal gates 114a and 124a and their respective dielectric caps 114b and 124b on top thereof. After forming replacement-metal gates 110 and 120, structure 220 may be exposed a top thereof for subsequent processing.

Figure 12:
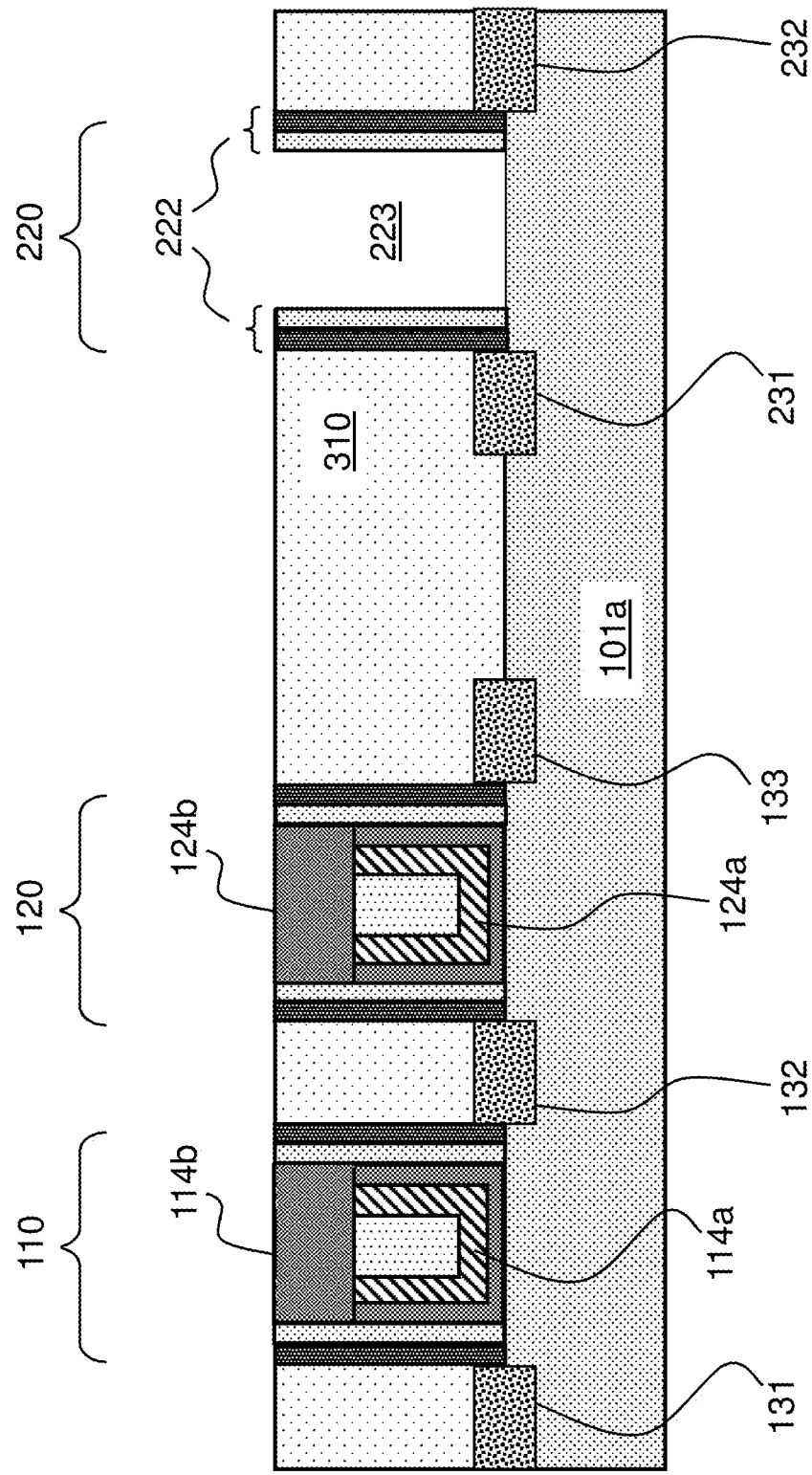
FIG. 12 is a demonstrative illustration of a step of a method of forming metal resistor and e-fuse integrated in a process of forming replacement-metal-gate with self-aligned contact, following the step illustrated in FIG. 11, according to one embodiment of present disclosure.

FIG. 12 is a demonstrative illustration of a step of a method of forming metal resistor and e-fuse integrated in a process of forming replacement-metal-gate with self-aligned contact, following the step illustrated in FIG. 11, according to one embodiment of present disclosure. More specifically, instead of forming sacrificial gate 221 into a metal resistor as being discussed above with regard to structure 10, here sacrificial gate 221 may be selectively removed from between sidewall spacers 222 to create an opening 223. The opening 223 leads to an exposed "channel" region of substrate 101a.

Figure 13:
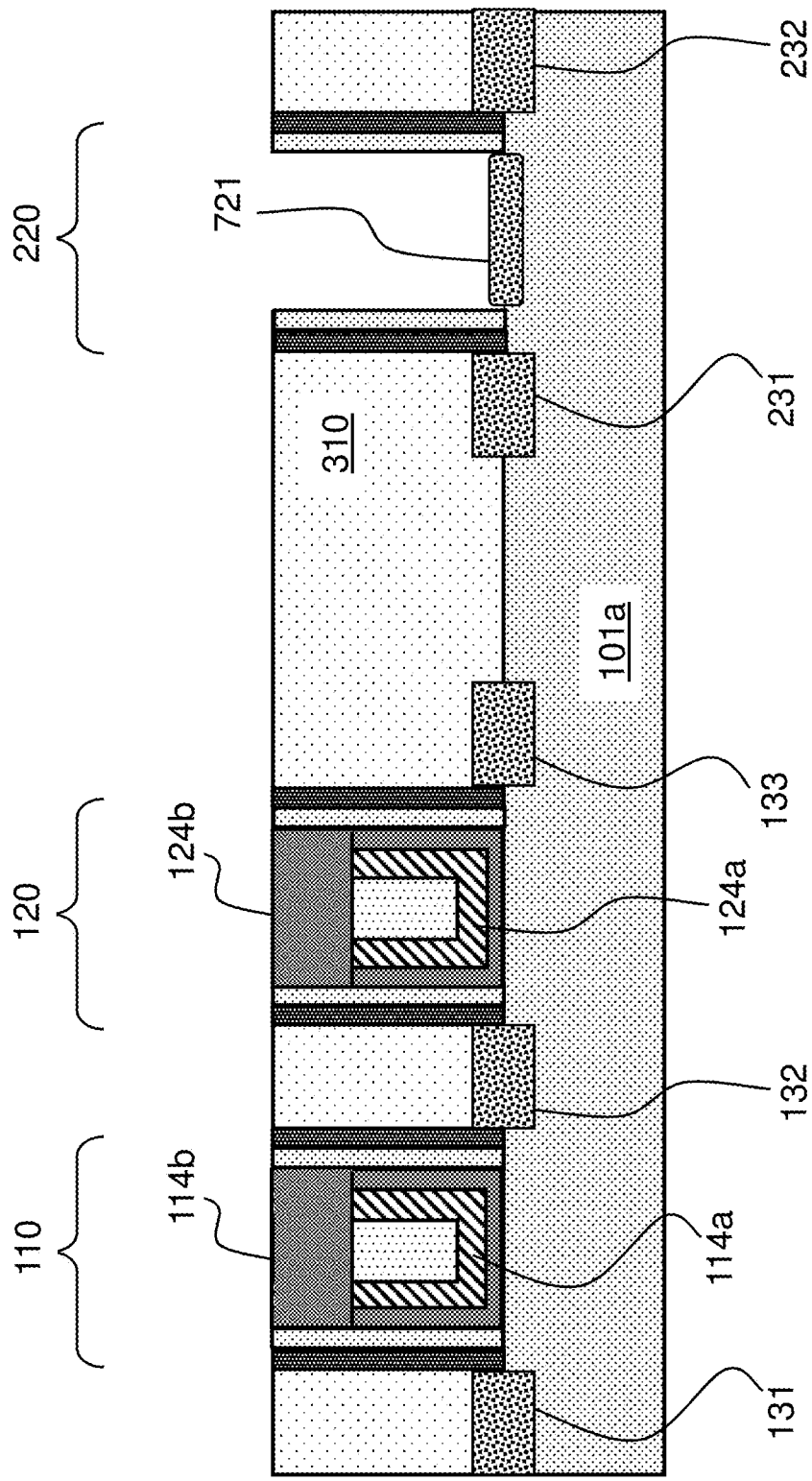
FIG. 13 is a demonstrative illustration of a step of a method of forming metal resistor and e-fuse integrated in a process of forming replacement-metal-gate with self-aligned contact, following the step illustrated in FIG. 12, according to one embodiment of present disclosure.

FIG. 13 is a demonstrative illustration of a step of a method of forming metal resistor and e-fuse integrated in a process of forming replacement-metal-gate with self-aligned contact, following the step illustrated in FIG. 12, according to one embodiment of present disclosure. Following the exposure of the "channel" region of structure 220, silicide 721 may be formed on a top portion of the exposed channel region in substrate 101a between sidewall spacers 222. The formation of silicide 721 may be made through, for example, depositing a layer of desired metal, such as nickel, on top of exposed substrate 101a which may be silicon, silicon-germanium (SiGe), or other types of substrate material. The deposited metal material is then subjected to a thermal annealing process to cause reaction with the underneath substrate material to form silicide 721. Any un-reacted metal material may subsequently be removed through for example a selective metal removing process as is known in the art.

Silicide 721 thus transforms structure 220 into a metal resistor or e-fuse depending upon its specific application. Contacts to silicide 721 (or metal resistor) may be made through silicide 231 and 232 formed in the "source/drain" regions of structure 220. Different from metal resistor 210 as being illustrated in FIG. 9, metal resistor 220 illustrated here in FIG. 13 provides a current flow from side-to-side (silicide 231 to silicide 232 or vice versus), via doping and extension regions under spacers 222, along a channel length direction, instead of along a channel width direction in-and-out the "paper" as in FIG. 9 for metal resistor 210.

Figure 14:
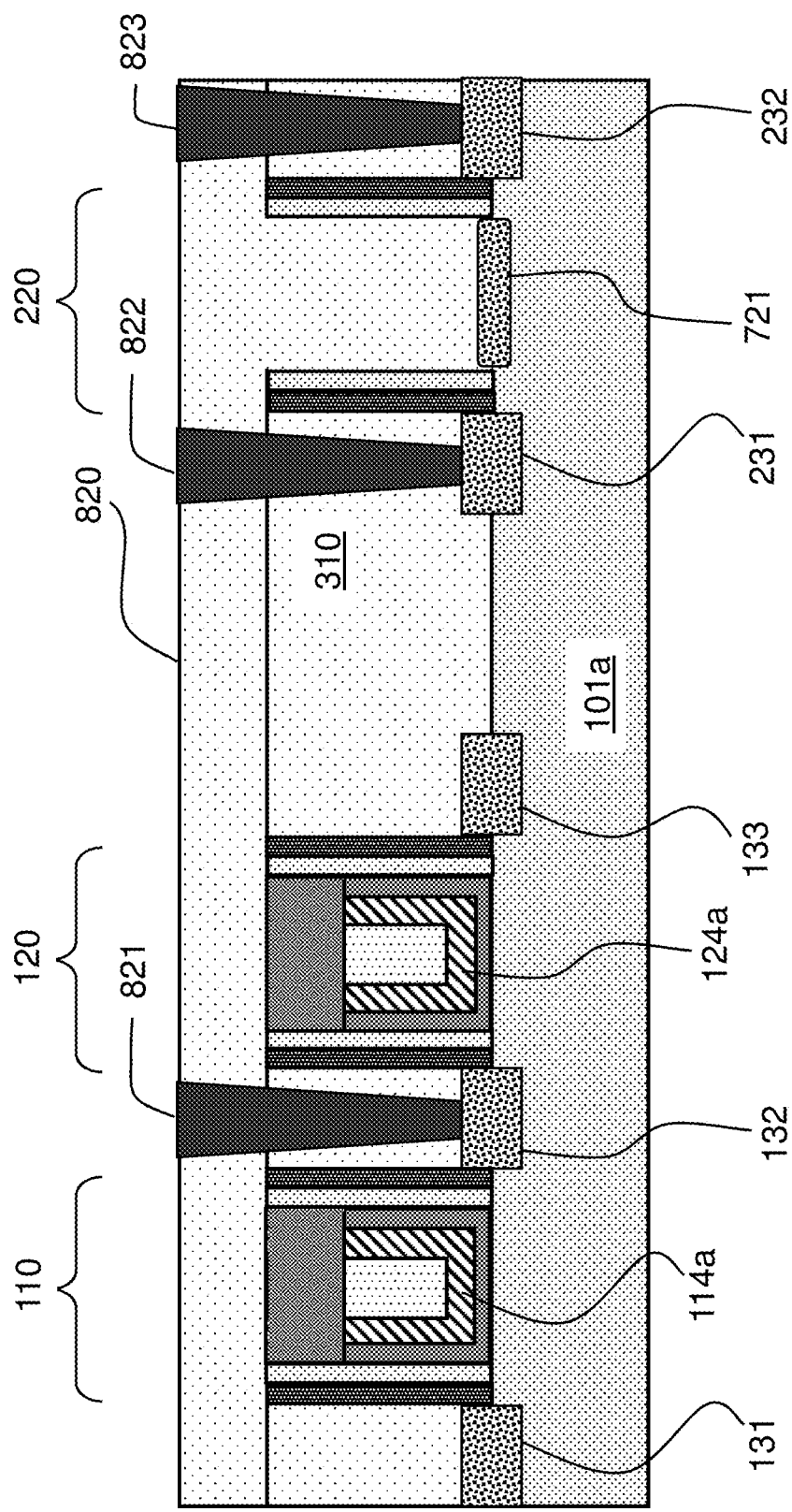
FIG. 14 is a demonstrative illustration of a step of a method of forming metal resistor and e-fuse integrated in a process of forming replacement-metal-gate with self-aligned contact, following the step illustrated in FIG. 13, according to one embodiment of present disclosure.

FIG. 14 is a demonstrative illustration of a step of a method of forming metal resistor and e-fuse integrated in a process of forming replacement-metal-gate with self-aligned contact, following the step illustrated in FIG. 13, according to one embodiment of present disclosure. After forming silicide 721 via opening 223 at the top of substrate 101a, the method may include filling opening 223 with one or more dielectric material to protect silicide 721. Dielectric material, same or different from those deposited inside opening 223, may continue to be deposited on top of dielectric layer 310 to form a dielectric layer 820 covering transistor structures 110 and 120, and the metal resistor structure 220. Via openings may be subsequently made inside dielectric layer 820 and possibly underneath dielectric layer 310 to expose underneath silicide contact regions 132, 231 and 232. Metal contacts which may be self-aligned such as 821 or none self-aligned such as 822 and 823 may be formed inside the via openings. Metal contacts 821, 822, and 823 provide electrical connections to the underneath transistors such as transistor 110 and to metal resistor 220 via silicide 231 and 232.

Figure 15:
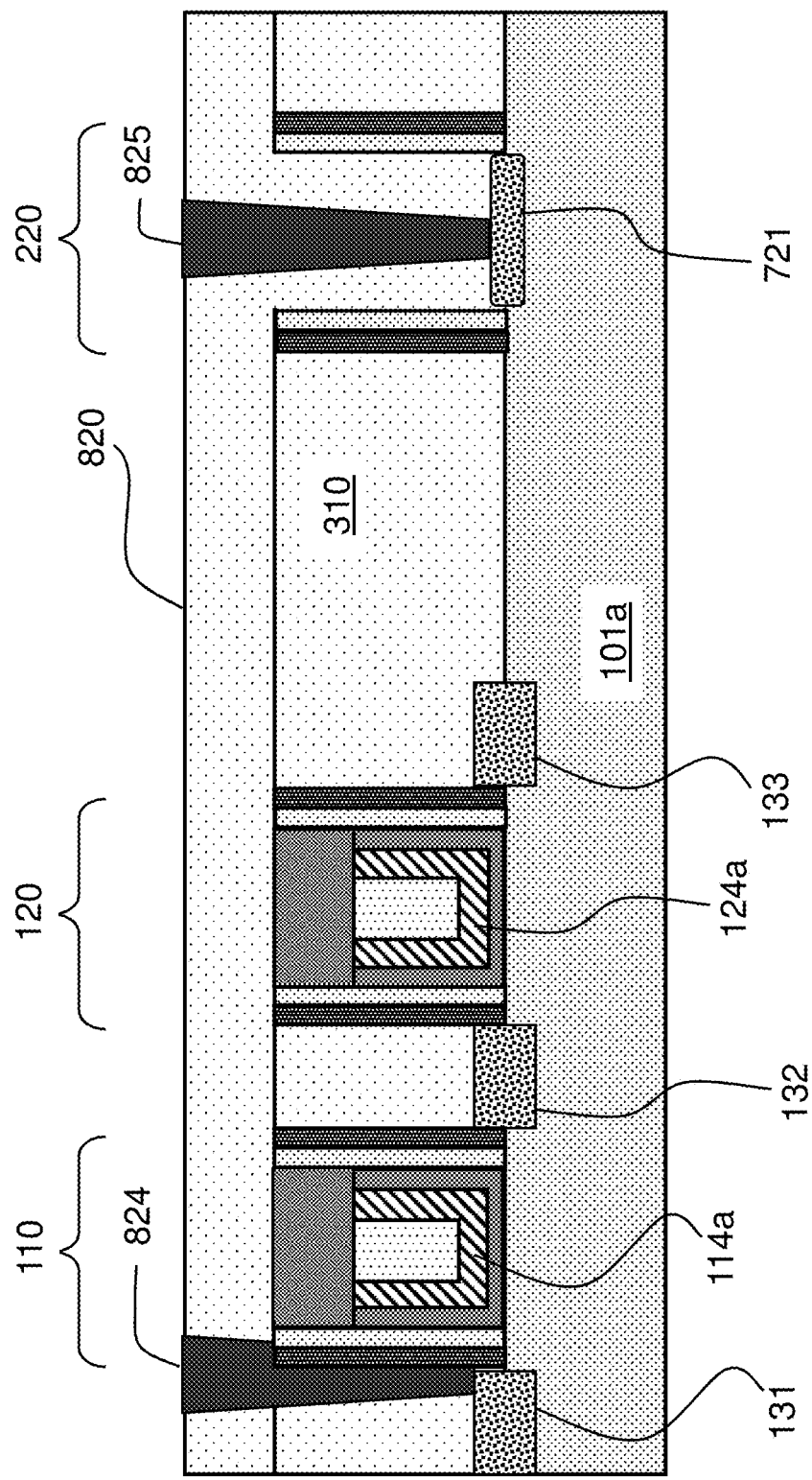
FIG. 15 is a demonstrative illustration of a step of a method of forming metal resistor and e-fuse integrated in a process of forming replacement-metal-gate with self-aligned contact, following the step illustrated in FIG. 13, according to another embodiment of present disclosure.

FIG. 15 is a demonstrative illustration of a step of a method of forming metal resistor and e-fuse integrated in a process of forming replacement-metal-gate with self-aligned contact, following the step illustrated in FIG. 13, according to another embodiment of present disclosure. After forming silicide 721 via opening 223 at the top of substrate 101a, the method may include filling opening 223 with one or more dielectric material to protect silicide 721. Dielectric material, same or different from those deposited inside opening 223, may continue to be deposited on top of dielectric layer 310 to form a dielectric layer 820 covering transistor structures 110 and 120, and the metal resistor structure 220. One or more via openings may be subsequently made inside dielectric layer 820 and inside underneath dielectric layer 310 to expose underneath silicide contact region 131 of transistor 110 and metal resistor 721. Next, metal contact 824, which may be self-aligned as being illustrated in FIG. 15, may be formed inside the via opening. Metal contact 825 may be formed to provide electric connection to underneath metal resistor 721. In this particular embodiment, electric current may be driven during operation in a direction perpendicular to this paper inside metal resistor 721. In this embodiment, silicide 231 and 232, as illustrated in FIG. 14, are not needed and thus their formation may be skipped, similarly to the structure illustrated in FIG. 9.

Figure 16:
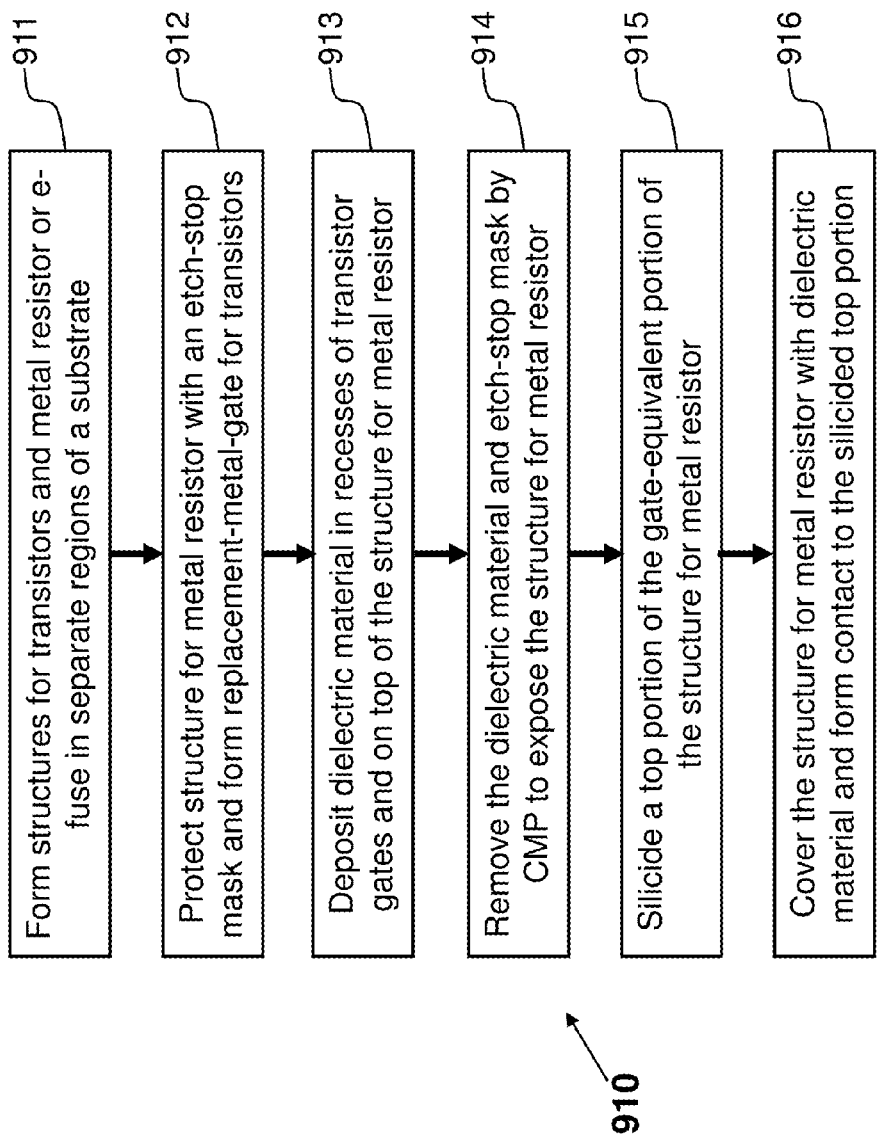
FIG. 16 is a simplified flow chart illustration of a method of forming metal resistor and e-fuse integrated in a process of forming replacement-metal-gate with self-aligned contact according to yet another embodiment of present disclosure.

FIG. 16 is a simplified flow chart illustration of a method of forming metal resistor and e-fuse integrated in a process of forming replacement-metal-gate with self-aligned contact according to yet another embodiment of present disclosure. According to one embodiment as being illustrated in chart 910, the method may include forming structures for transistors and for metal resistor or e-fuse in a replacement-metal-gate process as in step 911. The structures may be formed in different regions of a substrate. The different regions may be similar to each other, such as all being active regions, or different from each other, such as some being active regions some being non-active regions or insulated regions. The method may also include providing protection to the structure designated for forming metal resistor (or e-fuse) by forming an etch-stop mask on top thereof, while in the meantime performing regular replacement-metal-gate process on the structures designated for transistors to form metal gates as in step 912. Subsequently, dielectric caps may be formed on top of the metal gates by filling in the recesses created in an upper portion of the metal gates with dielectric material as in step 913, and the deposition may also deposit dielectric material on top of the structure designated for metal resistor. Next, the dielectric material may be removed through, for example, a chemical-mechanic-polishing (CMP) process as in step 914. The CMP process may also remove the etch-stop mask to expose the underneath structure for metal resistor. Since the structure for metal resistor is formed in a similar manner, and in a same process, as those of structures for transistors, there is the gate-equivalent portion of the structure for metal resistor, which is then silicided according to one embodiment of present disclosure as in step 915. For example, a top portion of the gate-equivalent portion is silicided to work as a metal resistor or e-fuse based upon what kind of application it may be used. After the silicidation, the structure for metal resistor may be covered by depositing a layer of dielectric material, nitride or oxide or any other suitable insulating material, on top thereof. Contacts to the underneath silicide are then formed to complete the formation of the metal resistor (or e-fuse) as in step 916.

Figure 17:
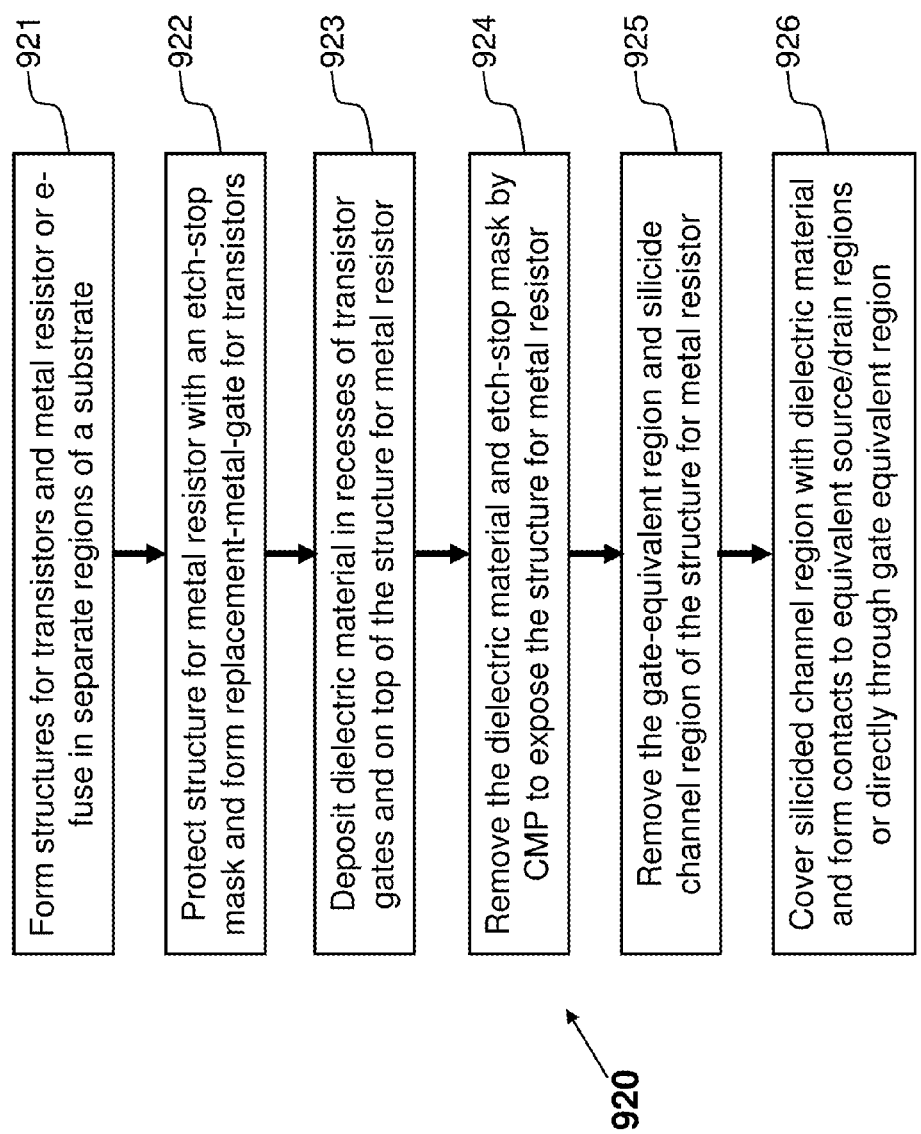
FIG. 17 is a simplified flow chart illustration of a method of forming metal resistor and e-fuse integrated in a process of forming replacement-metal-gate with self-aligned contact according to one more embodiment of present disclosure.

FIG. 17 is a simplified flow chart illustration of a method of forming metal resistor and e-fuse integrated in a process of forming replacement-metal-gate with self-aligned contact according to one more embodiment of present disclosure. In flow chart 920, steps 921-924 may be similar to those of steps 911-914 in flow chart 910. Namely, the method may include forming structures for transistors and for metal resistor or e-fuse in a replacement-metal-gate process as in step 921. The structures may be formed in different regions of a substrate. The method may also include providing protection to the structure designated for forming metal resistor (or e-fuse) by forming an etch-stop mask on top thereof, while in the meantime performing regular replacement-metal-gate process on the structures designated for transistors to form metal gates as in step 922. Subsequently, dielectric caps may be formed on top of the metal gates by filling in the recesses created in an upper portion of the metal gates with dielectric material as in step 923, and the deposition may also deposit dielectric material on top of the structure designated for metal resistor. Next, the dielectric material may be removed through, for example, a chemical-mechanic-polishing (CMP) process as in step 924. The CMP process may also remove the etch-stop mask to expose the underneath structure for metal resistor.

According to one embodiment of present disclosure, the method may include subsequently removing the gate-equivalent region through, for example, a selective metal removal process to expose underneath channel-equivalent region of the structure, in the substrate. The method further includes siliciding the exposed channel-equivalent region, as in step 925, to work as metal resistor or e-fuse. Following the silicidation of the channel-equivalent region, dielectric material may be used to fill up the opening created in gate-equivalent region of the structure and further on top of the structure overall to form a dielectric layer. Contacts may then be formed through the dielectric layer as in step 926 to contact source/drain-equivalent regions of the structure which connects to the silicided channel region and together providing the function of a metal resistor or e-fuse according to specific application of the structure.

According to another embodiment, contacts to the silicided channel region may be formed in step 926, alternatively, to be directly through the equivalent gate region to contact the silicided channel region, as being illustrated in FIG. 15. At least two contacts maybe formed to form a circuit path.

While certain features of the disclosure have been illustrated and described herein, many modifications, substitutions, changes, and equivalents will now occur to those of ordinary skill in the art. It is, therefore, to be understood that the appended claims are intended to cover all such modifications and changes as fall within the spirit of the disclosure.

What is claimed is:

1. A method comprising:
    forming a first transistor structure and a pair of second transistor structures on a semiconductor substrate, wherein the first transistor structure includes a dummy gate thereon, wherein a shared silicide region is positioned laterally between the pair of second transistor structures and directly contacts both of the pair of second transistor structures, and wherein the first transistor structure is laterally separated from the pair of second transistor structures;
    forming a mask only on the first transistor structure, the pair of second transistor structures remaining uncovered by the mask;
    forming a metal gate on each of the pair of second transistor structures to yield a set of transistors;
    forming a recess in each metal gate, before removal of the mask from the first transistor structure;
    depositing a dielectric material in the recess in each metal gate and over the mask on the first transistor structure, wherein an entire top portion of each metal gate in the recess is covered by the dielectric material;
    removing the dielectric material and the mask to expose the first transistor structure, without removing the dielectric material within the recess in each metal gate; and
    siliciding a top portion of the dummy gate of the first transistor structure to yield a resistor.

2. The method of claim 1, further comprising:
    forming a dielectric layer on the silicided top portion of the dummy gate of the first transistor structure; and
    forming at least two a contacts within the dielectric layer and in contact with the resistor.

3. The method of claim 1, wherein the first transistor structure has a same structure as each of the pair of second transistor structures.

4. The method of claim 1, wherein the removing of the dielectric material and the mask to expose the first transistor structure includes applying a chemical mechanical polishing (CMP) process.

5. The method of claim 1, further comprising siliciding a source/drain region of the first transistor structure.

6. A method comprising:
    forming a first transistor structure and a pair of second transistor structures on a semiconductor substrate, wherein each of the first transistor structure and the pair of second transistor structures includes a dummy gate thereon, wherein a shared silicide region is positioned laterally between the pair of second transistor structures and directly contacts both of the pair of second transistor structures, wherein the first transistor structure is laterally separated from the pair of second transistor structures;
    forming a mask only on the first transistor structure, the pair of second transistor structures remaining uncovered by the mask;
    replacing the dummy gate of the pair of second transistor structures with a metal gate to form a set of transistors;
    forming a recess in each metal gate, before removal of the mask from the first transistor structure;
    depositing a dielectric material in the recess in each metal gate and over the mask on the first transistor structure, wherein an entire top portion of each metal gate in the recess is covered by the dielectric material;
    removing the dielectric material and the mask to expose the first transistor structure, without removing the dielectric material within the recess in each metal gate; and
    siliciding a top portion of the dummy gate of the first transistor structure to form a resistor.

7. The method of claim 6, further comprising:
    forming a dielectric layer on the silicided top portion of the dummy gate of the first transistor structure; and
    forming at least two contacts within the dielectric layer and in contact with the resistor.

8. The method of claim 6, wherein the removing of the dielectric material and the mask to expose the first transistor structure includes applying a chemical mechanical polishing (CMP) process.

9. The method of claim 6, wherein the dielectric material and the mask each include a same dielectric material.

10. The method of claim 6, further comprising siliciding a source/drain region of the first transistor structure.

11. The method of claim 10, wherein the removing of the dielectric material and the mask to expose the first transistor structure includes applying a chemical mechanical polishing (CMP) process.

12. The method of claim 10, wherein the dielectric material and the mask include a same dielectric material.

13. A method comprising:
    forming a first and a pair of second transistor structures on a semiconductor substrate, wherein each of the first transistor structure and each of the pair of second transistor structures includes:

a source/drain region positioned within the semiconductor substrate, and a dummy gate positioned over the source/drain region, wherein a shared silicide region is positioned laterally between the pair of second transistor structures and directly contacts both of the pair of second transistor structures, wherein the first transistor structure is laterally separated from the pair of second transistor structures;

forming a mask only on the first transistor structure, the pair of second transistor structures remaining uncovered by the mask;

forming a replacement metal gate on each of the pair of second transistor structures to yield a set of transistors;

forming a recess in each metal gate, before removal of the mask from the first transistor structure;

depositing a dielectric material in the recess in each metal gate and over the mask on the first transistor structure, wherein an entire top portion of each metal gate in the recess is covered by the dielectric material;

removing the dielectric material and the mask to expose the first transistor structure, without removing the dielectric material within the recess in each metal gate; and siliciding a top portion of the dummy gate of the first transistor structure to form a resistor.

14. The method of claim 13, further comprising:

forming a dielectric layer on the silicided top portion of the dummy gate of the first transistor structure; and forming at least two contacts within the dielectric layer and in contact with the resistor.

* * * * *